United States Patent
Nakatsu (10) Patent No.: US 8,040,150 B2
(45) Date of Patent: Oct. 18, 2011

(54) IMPEDANCE ADJUSTMENT CIRCUIT

(75) Inventor: Isao Nakatsu, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/788,957

(22) Filed: May 27, 2010

(65) Prior Publication Data

US 2010/0321059 A1    Dec. 23, 2010

(30) Foreign Application Priority Data

Jun. 19, 2009  (JP) ................................. 2009-146177

(51) Int. Cl.
*H03K 17/16*  (2006.01)
*H03K 19/003*  (2006.01)
*H03K 1/00*  (2006.01)
*G11C 7/10*  (2006.01)

(52) U.S. Cl. ...................... 326/30; 327/108; 365/189.05

(58) Field of Classification Search ..................... 326/26, 326/30, 87; 327/108, 170, 172–176; 365/189.05, 365/189.11
See application file for complete search history.

(56) References Cited

U.S. PATENT DOCUMENTS

| | | | | |
|---|---|---|---|---|
| 6,762,620 B2 * | 7/2004 | Jang et al. | ........................ | 326/30 |
| 6,836,143 B2 * | 12/2004 | Song | ............................... | 326/30 |
| 7,342,412 B2 * | 3/2008 | Kim | ............................... | 326/30 |
| 2002/0050838 A1 * | 5/2002 | Kim et al. | ........................ | 326/30 |
| 2002/0196049 A1 * | 12/2002 | Yanagawa | ........................ | 326/30 |
| 2007/0103189 A1 * | 5/2007 | Chang et al. | .................... | 326/30 |

FOREIGN PATENT DOCUMENTS

| | | |
|---|---|---|
| JP | 2000-209078 (A) | 7/2000 |
| JP | 2005-61976 (A) | 3/2005 |
| JP | 2005-229552 (A) | 8/2005 |
| JP | 2006-203568 (A) | 8/2006 |

* cited by examiner

*Primary Examiner* — Shawki Ismail
*Assistant Examiner* — Dylan White
(74) *Attorney, Agent, or Firm* — Foley & Lardner LLP (57) ABSTRACT

An impedance adjustment circuit according to the present invention includes a first input buffer which detects that an input signal exceeds VREFA, a second input buffer which detects that the input signal exceeds VREFB, VREFB being higher than VREFA, a counter circuit A which performs count based on an output from the first input buffer, a counter circuit B which performs count based on an output from the second input buffer, and a termination resistor control circuit which controls impedance of a termination resistor provided in a termination of a transmission path based on the count in the counter circuit A and the count in the counter circuit B.

9 Claims, 6 Drawing Sheets

IMPEDANCE ADJUSTMENT CIRCUIT

INCORPORATION BY REFERENCE

This application is based upon and claims the benefit of priority from Japanese patent application No. 2009-146177, filed on Jun. 19, 2009, the disclosure of which is incorporated herein in its entirety by reference.

BACKGROUND

1. Field of the Invention

The present invention relates to a semiconductor integrated device, and more specifically, to an impedance adjustment circuit of an input circuit used for a high-speed transmission path.

2. Description of Related Art

In a field of a semiconductor integrated device, high-speed communication represented by DDR2 (double data rate 2), for example, has been increasingly employed in communication between semiconductor devices along with an increase of speed in an application set. When such a high-speed communication is employed, there is raised a problem of distortion of transmission signal waveforms caused by signal reflection. This requires impedance matching among an output buffer, a transmission path, and an input buffer. Without impedance matching, an input buffer end which is a receiving end cannot obtain sufficient signal amplitude or overshoot is occurred in a transmission signal, which causes occurrence of noise or distortion of the transmission signal due to reflection. This causes occurrence of error in communication data, which results in communication failure.

Increase in the communication speed causes considerable influence by characteristics of a transmission path on the signal. The influence given by the impedance characteristic on the transmission path cannot be ignored not only in wirings between products but also in fine wirings in a product package (bonding wire, bump (soldering ball), wiring in interposer, for example) or the like. Thus, increasing the accuracy of impedance adjustment circuits has been strongly required.

Figure 5:
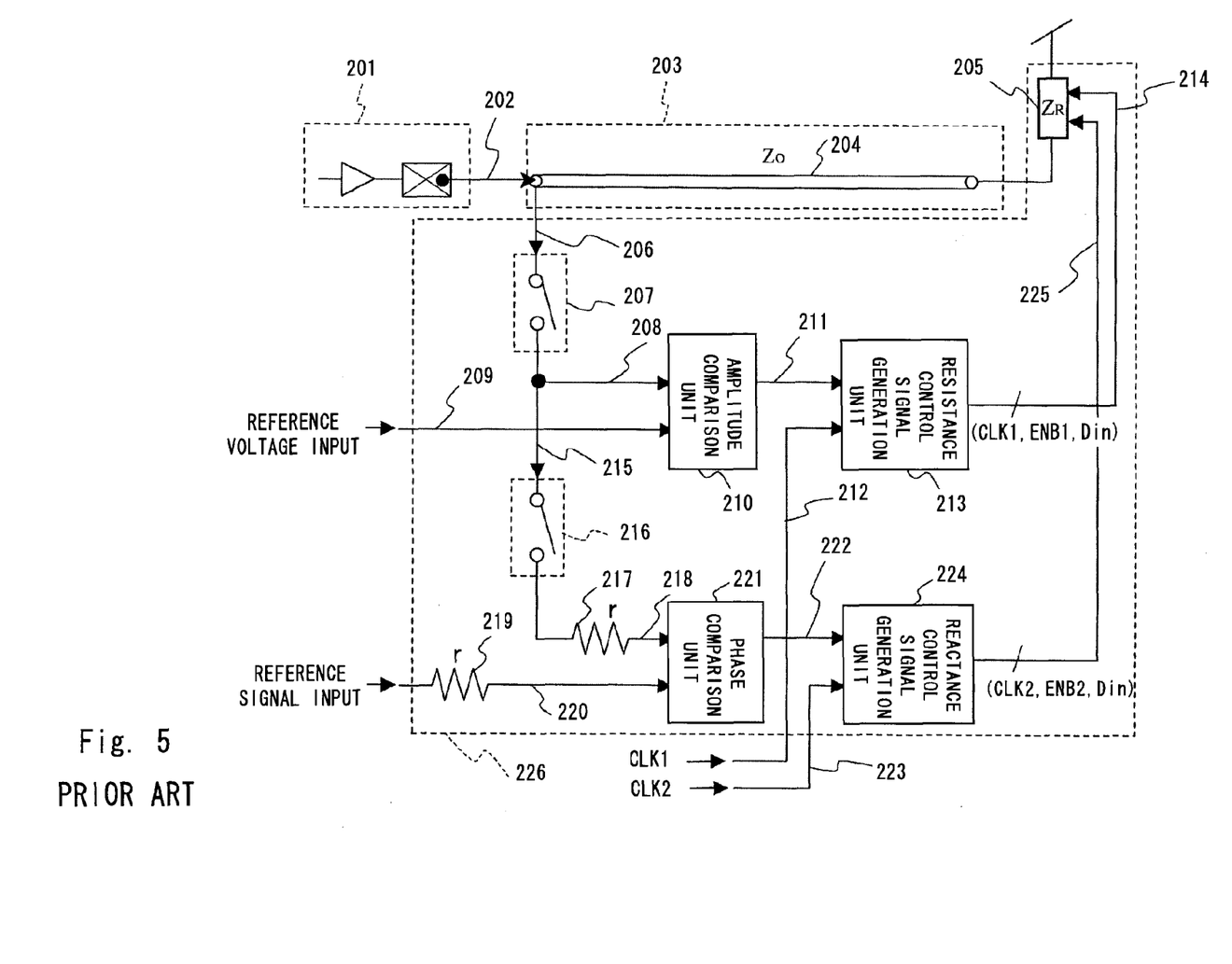
FIG. 5 is a diagram showing an example of the structure of an impedance control apparatus according to a prior art.
Figure 6:
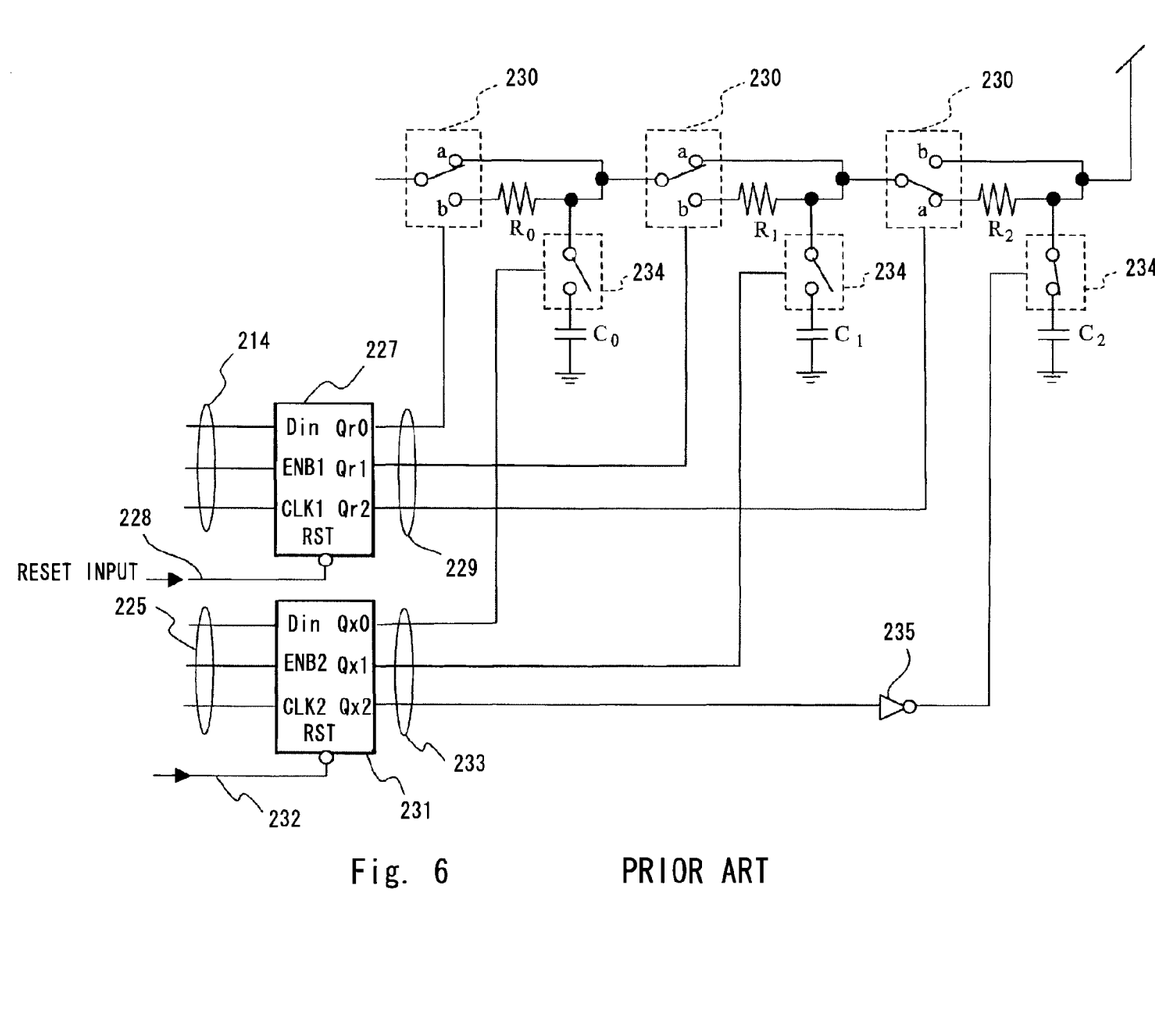
FIG. 6 is a diagram showing an example of the structure of a termination resistor (matching means) according to a prior art.

One example of the impedance control apparatus according to a related art is disclosed in Japanese Unexamined Patent Application Publication No. 2005-061976. Referring now to FIGS. 5 and 6, the impedance control apparatus disclosed in Japanese Unexamined Patent Application Publication No. 2005-061976 will be described.

FIG. 5 shows one example of the structure of the impedance control apparatus disclosed in Japanese Unexamined Patent Application Publication No. 2005-061976. An LSI output signal 202 is output from an LSI 201 which is a semiconductor integrated circuit to be inspected. The LSI output signal 202 is transmitted on an inspection substrate 203 which is an inspection apparatus of the semiconductor integrated circuit such as an LSI tester. A transmission path 204 on the inspection substrate 203 has a characteristic impedance Z0. An output signal from the transmission path 204 is input to an impedance control mechanism 226 of the impedance control apparatus.

A termination resistor (matching means) 205 connected to a termination of the transmission path 204 has impedance that can be varied. An LSI output signal 206 including the reflected wave is taken out from a transmission terminal neighborhood of the transmission path 204 and is connected to an amplitude comparing switch 207 (hereinafter simply referred to as switch 207) to start the amplitude comparison operation. The switch 207 is ON (the switch is closed) in starting the amplitude comparison operation.

An amplitude comparison unit 210 compares the voltage level of an amplitude comparing output signal 208 with the voltage level of an amplitude comparing reference signal 209, and outputs an amplitude comparison signal 211 indicating the comparison result. The amplitude comparing output signal 208 is the LSI output signal 206 including the reflected wave in this example. A resistance controlling clock signal 212 (CLK1) is externally input. A resistance control signal generation unit 213 generates a resistance control signal 214 that controls the resistance component of the impedance of the termination resistor 205 based on the amplitude comparison signal 211 and the resistance controlling clock signal 212 so that the difference between the characteristic impedance of the transmission path 204 and the resistance component of the impedance of the termination resistor 205 is within a certain range.

A phase comparing output signal 215 is a signal that is divided from the amplitude comparing output signal 208, and is the LSI output signal 206 including the reflected wave in this example. The phase comparing output signal 215 is connected to a phase comparing switch 216 (hereinafter simply called switch 216). The switch 216 is ON when the phase comparison operation is started.

A phase comparison unit 221 compares a phase of a phase comparing output signal 218 which passes through a resistor 217 with a phase of a phase comparing reference signal 220 which passes through a resistor 219, and outputs a phase comparison signal 222 indicating the comparison result. A reactance controlling clock signal 223 (CLK2) is externally input. A reactance control signal generation unit 224 generates a reactance control signal 225 that controls reactance component of the impedance of the termination resistor 205 based on the phase comparison signal 222 and the reactance controlling clock signal 223 so that the difference between the characteristic impedance of the transmission path 204 and the reactance component of the impedance of the termination resistor 205 is within a certain range.

FIG. 6 is a diagram showing one example of the structure of a termination resistor (matching means) 205 disclosed in Japanese Unexamined Patent Application Publication No. 2005-061976. A shift resistor 227 to change resistance values of the termination resistor 205 outputs output signals $Q_{r0}$, $Q_{r1}$, and $Q_{r2}$. A signal 228 indicates a reset signal of the shift resistor 227, and a signal 229 indicates output signals of the shift resistor 227.

A shift resistor 231 outputs output signals $Q_{x0}$, $Q_{x1}$, and $Q_{x2}$. A signal 232 indicates a reset signal of the shift resistor 231, and a signal 233 indicates output signals of the shift resistor 231.

A switch 230 is opened or closed according to the output signals 229. The switch 230 changes resistance values of the termination resistor 205. The switch 230 is connected to a terminal a when a potential level of an input signal is Low, and is connected to a terminal b when a potential level of an input signal is High. In summary, the switch 230 is connected to a terminal a when the potential level of the output signals $Q_{r0}$, $Q_{r1}$, $Q_{r2}$ is Low, and is connected to a terminal b when the potential level is High.

A switch 234 is opened or closed according to the output signal 233. The switch 234 changes capacitance values of the termination resistor 205. The switch 234 is OFF (the switch is opened) when a potential level of an input signal is Low, and is ON when a potential level of an input signal is High. In summary, when the potential level of the output signals $Q_{x0}$, $Q_{x1}$, and $Q_{x2}$ is Low, the switches 234 connected to capacitors $C_0$, $C_1$ are OFF, and the switch 234 connected to the capacitor $C_2$ is ON as the output signal $Q_{x2}$ is input through an inverter 235. When the potential level is High, the switches 234 connected to the capacitors $C_0$, $C_1$ are ON, and the switch 234 connected to the capacitor $C_2$ is OFF.

FIG. 6 shows a case in which the termination resistor 205 is in an initial state. In the initial state, the resistance value of the termination resistor 205 is $R_2$, and the capacitance value is $C_2$. The relation among the resistance values $R_2$, $R_1$, and $R_0$ is $R_2 > R_1 > R_0$. The relation among the capacitance values $C_2$, $C_1$, and $C_0$ is $C_2 > C_1 > C_0$.

The impedance control mechanism disclosed in Japanese Unexamined Patent Application Publication No. 2005-061976 includes (1) a mechanism that compares the amplitudes of the amplitude comparing reference signal with the LSI output signal including the reflected wave, and controls the resistance component (real part) of the impedance of the termination resistor based on the amplitude comparison result so that the difference of the resistance component between the characteristic impedance of the transmission path and the impedance of the termination resistor (matching means) is within a certain range, and (2) a mechanism that compares the phases of the phase comparing reference signal with the LSI output signal including the reflected wave, and controls the reactance component (imaginary part) of the impedance of the termination resistor based on the phase comparison result so that the difference of the reactance component between the impedance of the termination resistor and the characteristic impedance of the transmission path is within a certain range. In the impedance control mechanism disclosed in Japanese Unexamined Patent Application Publication No. 2005-061976, an input signal is compared with a reference voltage, and a termination resistor is determined using the amplitude of the input signal that is judged, so as to adjust the input impedance.

Other techniques related to the present invention are disclosed in Japanese Unexamined Patent Application Publication No. 2005-229552 and Japanese Unexamined Patent Application Publication No. 2006-203568, disclosing a slew rate control device to prevent malfunction by detecting presence or absence of ringing in output signal waveforms of an output buffer and changing driving ability of drive means according to the detection result.

Further, Japanese Unexamined Patent Application Publication No. 2000-209078 discloses a semiconductor device that enables to suppress ringing occurred in an output signal output from an output circuit when the output signal transits.

SUMMARY

However, the present inventors have found a problem in the technique disclosed in Japanese Unexamined Patent Application Publication No. 2005-061976 that it is impossible to adjust the impedance based on the presence or absence of overshoot that is produced in a receiving end of a transmission path. The reason for it is that the technique disclosed in Japanese Unexamined Patent Application Publication No. 2005-061976 has the structure to measure the signal amplitude and observes whether the signal amplitude satisfies the reference value. Overshoot refers to an excess of the potential beyond the reference value, and it arises temporarily in the signal waveform. Thus, according to the technique disclosed in Japanese Unexamined Patent Application Publication No. 2005-061976, occurrence of overshoot cannot be detected, and the optimal impedance adjustment that makes it possible to suppress occurrence of overshoot cannot be realized.

If occurrence of overshoot in the signal waveform cannot be suppressed, the noise due to the reflection or overshoot is overlapped with the signal of the transmission path, thereby causes distortion in the signal waveform. Hence, the standard value required for the signal in the transmission path cannot be satisfied and error of data reception is occurred, which degrades data reliability. This phenomenon is specifically occurred in communication in short cycles. Thus, more serious problem may be caused in performing higher speed communication.

In the techniques disclosed in Japanese Unexamined Patent Application Publication No. 2005-229552 and Japanese Unexamined Patent Application Publication No. 2006-203568, the position at which the output signal waveform exceeds a certain level is judged as overshoot or undershoot. The judgment level to detect overshoot is $Vcc+\Delta V$, and the judgment level to detect undershoot is $Vss-\Delta V$. Hence, because of the judgment levels being out of a range of the operation voltage, at least two kinds of power supply voltages need to be provided, which makes the structure of the ESD protection circuit of the output buffer complicated.

Furthermore, according to the technique disclosed in Japanese Unexamined Patent Application Publication No. 2000-209078, flip-flops of the detection circuits need to be reset before transition of the output signal in the detection circuits of overshoot and undershoot. As the technique disclosed in Japanese Unexamined Patent Application Publication No. 2000-209078 is intended for the output buffer, transition of the output signal can be known in advance. Thus, it does not disclose the method of generating the reset signal. However, the technique disclosed in Japanese Unexamined Patent Application Publication No. 2000-209078 cannot be directly applied to the input buffer in which a transition point of the output signal cannot be known in advance. The same problem exists in Japanese Unexamined Patent Application Publication No. 2005-229552 and Japanese Unexamined Patent Application Publication No. 2006-203568 that are intended for output buffers.

Furthermore, the technique disclosed in Japanese Unexamined Patent Application Publication No. 2000-209078 is to detect overshoot and undershoot using a threshold value of the input buffer which receives feed-back instead of using the reference potential. Thus, the variations of the judgment level become large and the detection property is degraded depending on the variations in production or environment such as operating temperature.

A first exemplary aspect of the present invention is an impedance adjustment circuit that controls impedance of a transmission path in which an input signal to input buffers provided in a semiconductor device is transmitted, the impedance adjustment circuit including a termination resistor which is provided at a termination of the transmission path, a first comparator which detects that the input signal exceeds a certain first voltage, a second comparator which detects that the input signal exceeds a certain second voltage, the second voltage being higher than the first voltage, a first counter which performs count based on an output from the first comparator, a second counter which performs count based on an output from the second comparator, and a termination resistor control circuit which controls impedance of the termination resistor based on the count in the first counter and the count in the second counter.

The impedance adjustment circuit according to the present invention includes two comparators detecting that the input signal exceeds the reference first and second voltages, and two counters that perform count operations based on outputs from the first comparator and the second comparator. The impedance adjustment circuit judges presence or absence of occurrence of overshoot and the amplitude of the input signal from output values from the two counters. Hence, the impedance of the input buffer end of the transmission path can be optimized.

According to the impedance adjustment circuit of the present invention, it is possible to provide the impedance adjustment circuit that is able to judge presence or absence of occurrence of overshoot and the signal amplitude of the input signal and to optimize the impedance of the input buffer end of the transmission path.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

The specific exemplary embodiments will be described hereinafter in detail with reference to the drawings. For the sake of clarity, the following description and the drawings are partially omitted or simplified as appropriate. Throughout the drawings, the same components and parts are denoted by the same reference symbols, and description thereof will be omitted.

First Exemplary Embodiment

Figure 1:
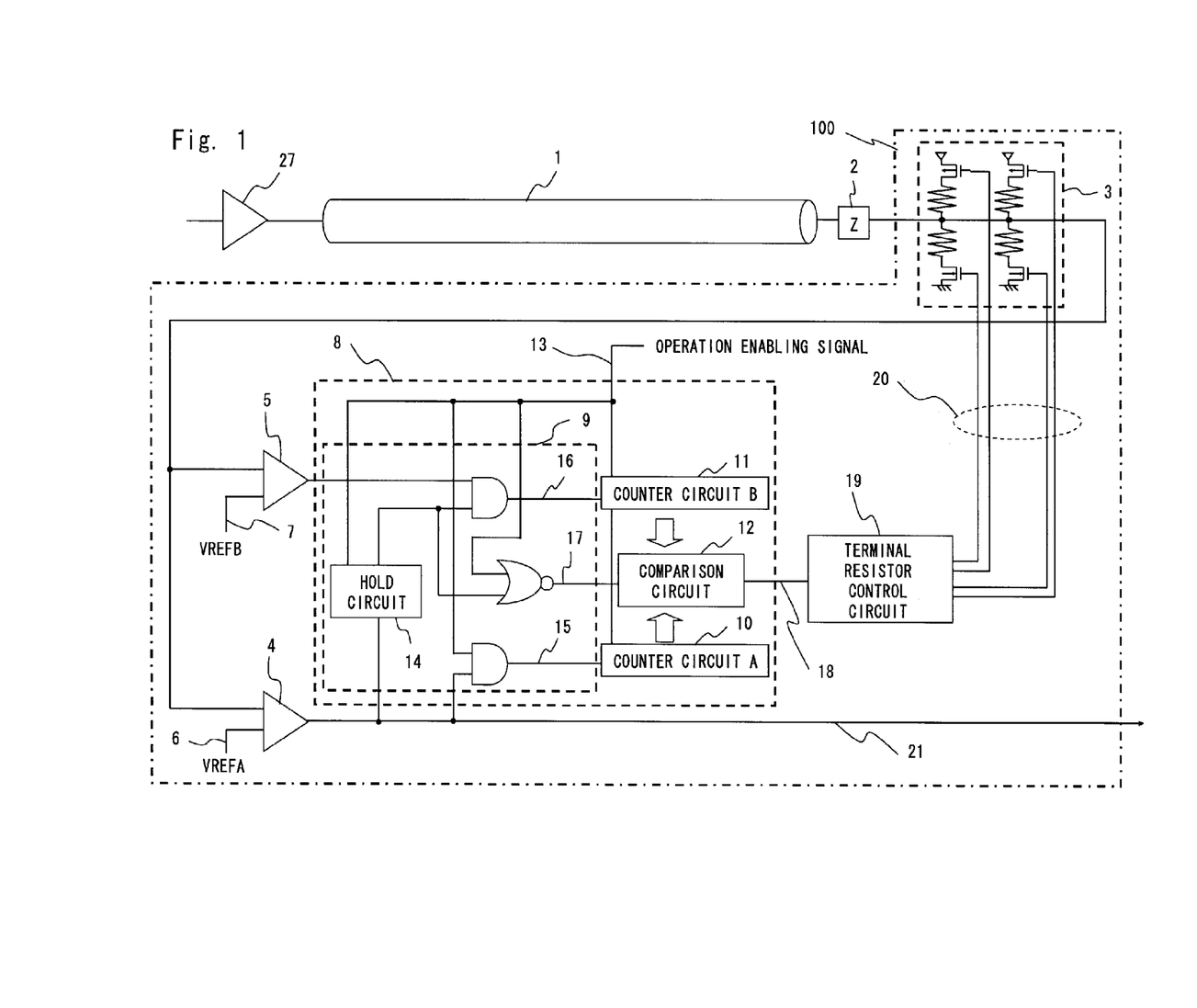
FIG. 1 is a block diagram showing an impedance adjustment circuit of an input signal according to a first exemplary embodiment.
Figure 2:
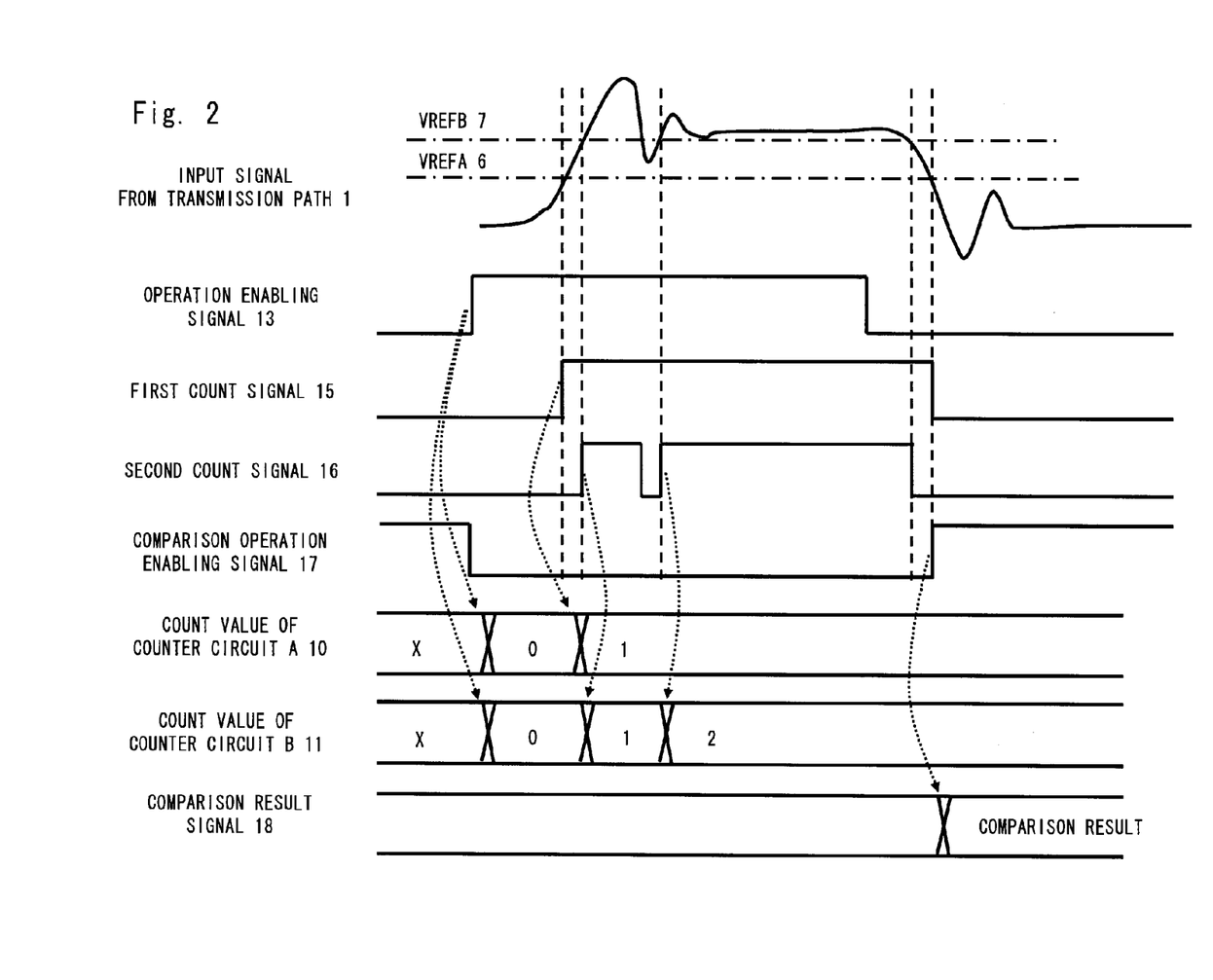
FIG. 2 is a timing chart describing an example of the operation of the impedance adjustment circuit according to the first exemplary embodiment.
Figure 3:
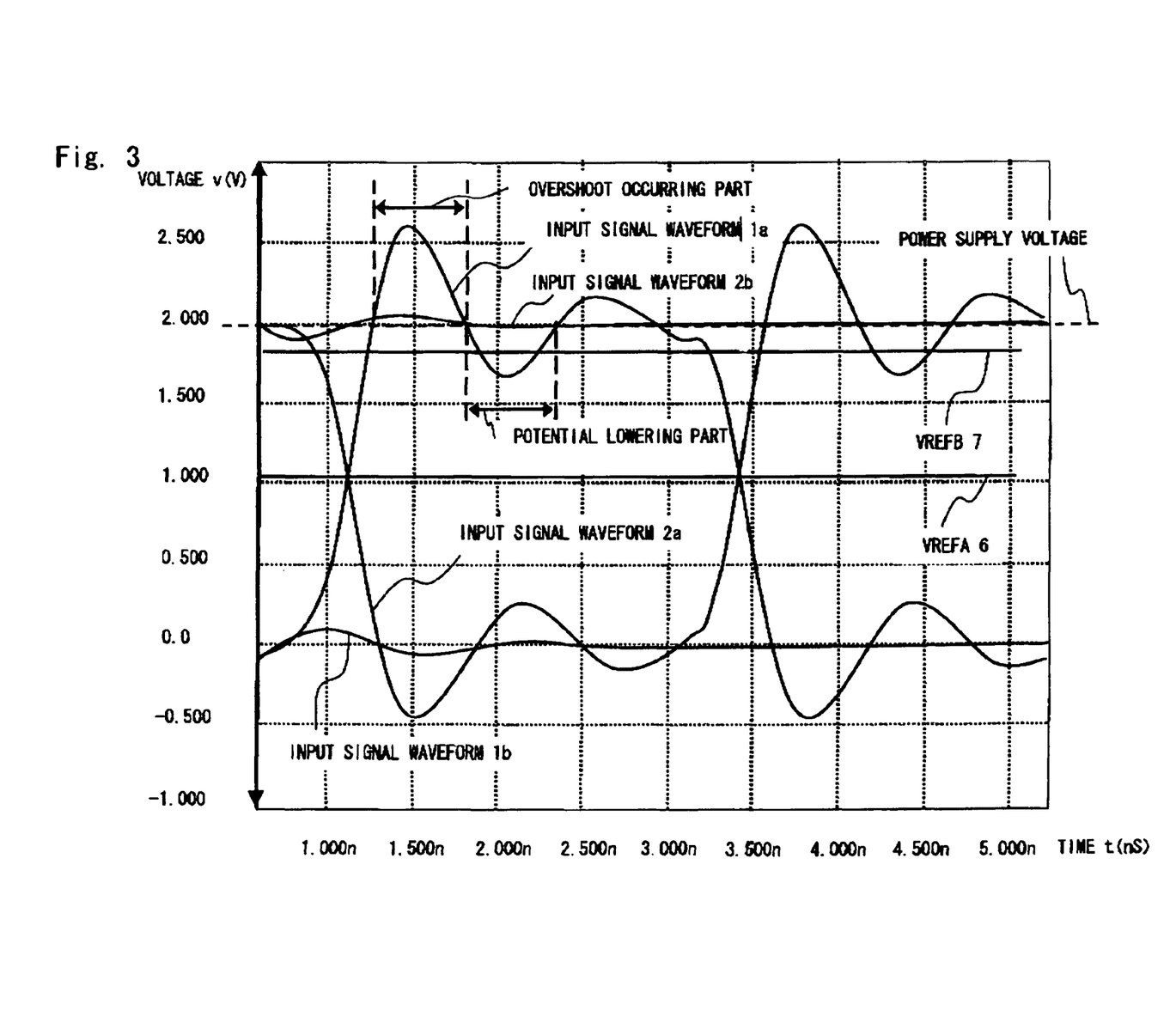
FIG. 3 is a diagram showing an example of waveforms in a transmission path according to the first exemplary embodiment.

Referring to FIGS. 1 to 3, an impedance adjustment circuit according to the first exemplary embodiment of the present invention will be described. FIG. 1 is a block diagram showing the impedance adjustment circuit according to the first exemplary embodiment of the present invention.

As shown in FIG. 1, a communication signal output from an output buffer 27 is input to a package part impedance 2 through a transmission path 1. The communication signal is input to an impedance adjustment circuit 100 through the package part impedance 2. The impedance adjustment circuit 100 includes a termination resistor 3, a first input buffer 4, a second input buffer 5, an input signal level detection circuit 8, and a termination resistor control circuit 19. The package part impedance 2 indicates impedance of a terminal of a package and impedance between the terminal and the termination resistor 3.

Upon receiving a termination resistor control signal 20, the termination resistor 3 switches values of the termination resistor. Although the termination resistor 3 has the Thevinin's structure in the first exemplary embodiment as an example, it may be formed by a damping resistor in which resistors are inserted in the transmission path in series, as shown in FIG. 6.

The communication signal is transmitted to the first input buffer 4 and the second input buffer 5 through the termination resistor 3. The first input buffer 4 and the second input buffer 5 have reference voltages that are different from each other (hereinafter called VREFA 6 and VREFB 7). In this example, the relation between VREFA 6 and VREFB 7 is shown by "VREFB 7>VREFA 6".

The first input buffer 4 compares the input signal from the transmission path 1 with the reference voltage value (VREFA 6), and outputs a received data signal 21. In the first exemplary embodiment, the received data signal 21 is High when the input signal from the transmission path 1 exceeds the reference voltage value of VREFA 6, and is Low in other cases. In the first exemplary embodiment, the received data signal 21 output from the first input buffer 4 also functions as data signals for communication. Thus, the received data signal 21 may also be output to other circuits in the semiconductor device including the input signal level detection circuit 8 described below. As the VREFA 6, the potential that is defined according to the communication method that is employed is applied.

The second input buffer 5 compares the input signal from the transmission path 1 with the reference voltage value (VREFB 7), and outputs the comparison result. Similarly to the first input buffer 4, the second input buffer 5 outputs High when the input signal from the transmission path 1 exceeds the reference voltage value of VREFB 7, and outputs Low in other cases. The reference voltages VREFA 6 and VREFB 7 may be generated in the semiconductor device, or may be input using an external device.

The input signal level detection circuit 8 includes a count control circuit 9, a counter circuit A 10, a counter circuit B 11, and a comparison circuit 12. The received data signal 21 output from the first input buffer 4, the output signal from the second input buffer 5, and an operation enabling signal 13 are input to the count control circuit 9. The operation enabling signal 13 is the signal indicating the operation permission of the impedance adjustment performed by the impedance adjustment circuit 100. In the first exemplary embodiment, the operation enabling signal 13 is High when the operation is permitted, and is Low when the operation is not permitted.

The count control circuit 9 generates a first count signal 15 from a logical AND between the operation enabling signal 13 and the received data signal 21, and outputs the logical AND to the counter circuit A 10. The count control circuit 9 further generates a second count signal 16 from a logical AND of an output signal of a hold circuit 14 and the output signal of the second input buffer 5, and outputs the logical AND to the counter circuit B 11. Further, the count control circuit 9 generates a comparison operation enabling signal 17 from a negative OR between the output signal of the hold circuit 14 and the operation enabling signal 13, and outputs the negative OR to the comparison circuit 12.

The hold circuit 14 holds the operation enabling signal 13 and the received data signal 21, and generates a period in which the count operation of the counter circuit B 11 is performed. The hold circuit 14 in the first exemplary embodiment sets the output to High when the operation enabling signal 13 is High and the received data signal 21 is High. Even when the operation enabling signal 13 becomes Low while the received data signal 21 is High, the hold circuit 14 continues to output High unless the received data signal 21 becomes Low.

The counter circuit A 10 initializes the count value to zero at a timing at which the operation enabling signal 13 is raised. Further, the counter circuit A 10 counts a rising edge of the first count signal 15, and outputs the count value to the comparison circuit 12.

The counter circuit B 11 initializes the count value to zero at a timing at which the operation enabling signal 13 is raised. Further, the counter circuit B 11 counts a rising edge of the second count signal 16, and outputs the count value to the comparison circuit 12.

The comparison circuit 12 compares the count value output from the counter circuit A 10 with the count value output from the counter circuit B 11, and outputs a comparison result signal 18 to the termination resistor control circuit 19 while the comparison operation enabling signal 17 is High. In the period in which the comparison operation enabling signal 17 is Low, the comparison circuit 12 holds the comparison result that has already been obtained without performing comparing operation.

The termination resistor control circuit 19 judges increase or decrease of the resistance value of the termination resistor 3 based on the comparison result signal 18, and outputs the termination resistor control signal 20. The detail of the judging method based on the comparison result signal 18 will be described later.

The impedance adjustment circuit 100 counts the number of times that the potential of the input signal exceeds the predetermined reference voltage during the period in which the input signal from the transmission path 1 becomes High, so as to judge presence or absence of occurrence of overshoot. Hence, the impedance adjustment circuit 100 adjusts the input impedance to be optimal.

Referring next to FIGS. 2 and 3, the operation of the impedance adjustment circuit according to the first exemplary embodiment will be described. FIG. 2 is a timing chart showing the operation of the impedance adjustment circuit 100 according to the first exemplary embodiment of the present invention.

As shown in FIG. 2, when performing the impedance adjustment, the impedance adjustment circuit 100 sets the operation enabling signal 13 to High, so as to allow the operation of the input signal level detection circuit 8. When the operation enabling signal 13 is set High, the counter values of the counter circuit A 10 and the counter circuit B 11 are initialized to zero. After the counter values are initialized, the counter circuit A 10 counts the rising edge of the received data signal 21 (which means that the rising edge of the first count signal 15 is counted).

In order to detect overshoot in the period in which the input signal from the transmission path 1 becomes High, the count control circuit 9 makes the hold circuit 14 output High in the period in which the input signal from the transmission path 1 exceeds the potential of VREFA 6 and the received data signal 21 becomes High. When the output signal from the hold circuit 14 is High, the count operation by the counter circuit B 11 is allowed. When the input signal from the transmission path 1 exceeds the potential of VREFB 7 and High is output from the second input buffer 5 while the count operation of the counter circuit B 11 is allowed, the counter circuit B 11 counts the rising edge of the output signal from the second input buffer 5 (which means the rising edge of the second count signal 16 is counted).

The count control circuit 9 sets the comparison operation enabling signal 17 to High when the operation enabling signal 13 is Low and the input signal from the transmission path 1 is lower than the potential of VREFA 6. The comparison circuit 12 compares the count value output from the counter circuit A 10 with the count value output from the counter circuit B 11 in the period in which the comparison operation enabling signal 17 is High, and generates the comparison result signal 18.

FIG. 3 is a diagram showing an example of waveforms of the signals input from the transmission path 1. In the example shown in FIG. 3, it is assumed that the power supply voltage ranges of the output buffer 27, the first input buffer 4, and the second input buffer 5 are from 0 V to 2 V. In the example shown in FIG. 3, waveforms of the input signals in a certain time are shown while being overlapped with one another. An input signal waveform 1b shows a waveform that follows an input signal waveform 1a, and indicates the steady state of Low output. An input signal waveform 2b shows a waveform that follows an input signal waveform 2a, and indicates the steady state of High output.

Taking the input signal waveform 1a as an example, when the resistance value of the termination resistor 3 is large, overshoot, which is the phenomenon that the potential of the input signal exceeds the power supply voltage, is occurred when the input signal is raised from Low to High (shown as overshoot occurring part in the drawing). Further, a period in which the potential of the input signal becomes temporarily lower than the power supply voltage is occurred immediately after the occurrence of overshoot (shown as potential lowering part of input signal in the drawing). The potential of VREFB 7 is preliminarily set to the value which is higher than the lowest potential of the potential lowering part and is equal to or higher than the lowest value of the signal amplitude that is required in the input signal from the transmission path 1.

First, overshoot is occurred in the input signal from the transmission path 1, and the output of the second input buffer 5 is Low due to the potential decrease of the input signal immediately after the occurrence of overshoot. The potential of the input signal is again increased after once decreased, and the second input buffer 5 outputs High when the potential of the input signal exceeds the potential of VREFB 7. Then, the counter circuit B 11 again counts the rising edge of the output of the second input buffer 5.

After that, the operation enabling signal 13 becomes Low and the received data signal 21 becomes Low, so that High is output from the count control circuit 9 as the comparison operation enabling signal 17. Thus, the comparison circuit 12 compares the count value output from the counter circuit A 10 with the count value output from the counter circuit B 11. The respective value of each counter can be shown as follows according to each state of the input signal from the transmission path 1:

(i) when overshoot is occurred,
value of the counter circuit B 11>value of the counter circuit A 10;
(ii) when overshoot is not occurred and the signal amplitude satisfies the certain potential,
value of the counter circuit B 11=value of the counter circuit A 10; and
(iii) when the signal amplitude does not satisfy the certain potential width,
value of the counter circuit B 11<value of the counter circuit A 10.

The termination resistor control circuit 19 judges the state of the input signal from the transmission path 1 based on the result output from the comparison circuit 12, and switches the resistance values of the termination resistor 3. In short, when the result of the comparison circuit 12 is "(i): value of the counter circuit B 11>value of the counter circuit A 10", the termination resistor control circuit 19 judges that the overshoot has occurred, and performs control to reduce the termination resistance value (switches the resistance values of the termination resistor 3 to a smaller value). When the result of the comparison circuit 12 is "(iii): value of the counter circuit B 11<value of the counter circuit A 10", the termination resistor control circuit 19 judges that the signal amplitude does not satisfy the predetermined width, and performs control to increase the termination resistance value (switches the resistance values of the termination resistor 3 to a larger value). Hence, the impedance of the input buffer ends of the first input buffer 4 and the second input buffer 5 seen from the transmission path 1 is adjusted. The range of the adjustable resistance value of the termination resistance value adjusted by the termination resistor control circuit 19 and the termination resistor 3 is arbitrarily specified in advance in consideration of the properties of the transmission path 1 and the package part impedance 2.

The impedance adjustment circuit 100 executes the impedance matching operation for a plurality of times, so as to optimize the input impedance. Although it is described in the example shown in FIG. 3 that the operation permission is given based on the operation enabling signal 13 for the period in which High of the input signal from the transmission path 1 is occurred once, the operation permission may be performed based on the operation enabling signal 13 for the period in which High of the input signal from the transmission path 1 is occurred for a plurality of times.

Further, in the first exemplary embodiment, it is possible to detect occurrence of undershoot of the input signal from the transmission path 1 and to perform impedance control by including a circuit that arbitrarily inverts the outputs of the second input buffer 5 and the received data signal 21, and setting the potentials of VREFA 6 and VREFB 7 to satisfy the relation of "VREFA 6>VREFB 7".

As stated above, the impedance adjustment circuit 100 according to the first exemplary embodiment includes the two input buffers 4 and 5 which judge that the input signal is in the High period, the counter circuit A 10 and the counter circuit B 11 which count the number of times that the potential of the input signal exceeds the predetermined reference voltages VREFA 6 and VREFB 7 in the High period, and the comparison circuit 12 which detects occurrence of overshoot based on the count values. Accordingly, the impedance adjustment circuit 100 is able to judge presence or absence of occurrence of overshoot and the amplitude of the input signal, so as to adjust the impedance in the input buffer end. Hence, distortion of the signal waveform due to the reflection or the noise can be suppressed in the signal of the transmission path 1. Thus, it is possible to receive the data without causing distortion in the signal waveform of the signal output from the output buffer on the data transmitting side. Hence, the error of the received data can be prevented, and the reliability of the data in high-speed communication can be enhanced.

Second Exemplary Embodiment

Figure 4:
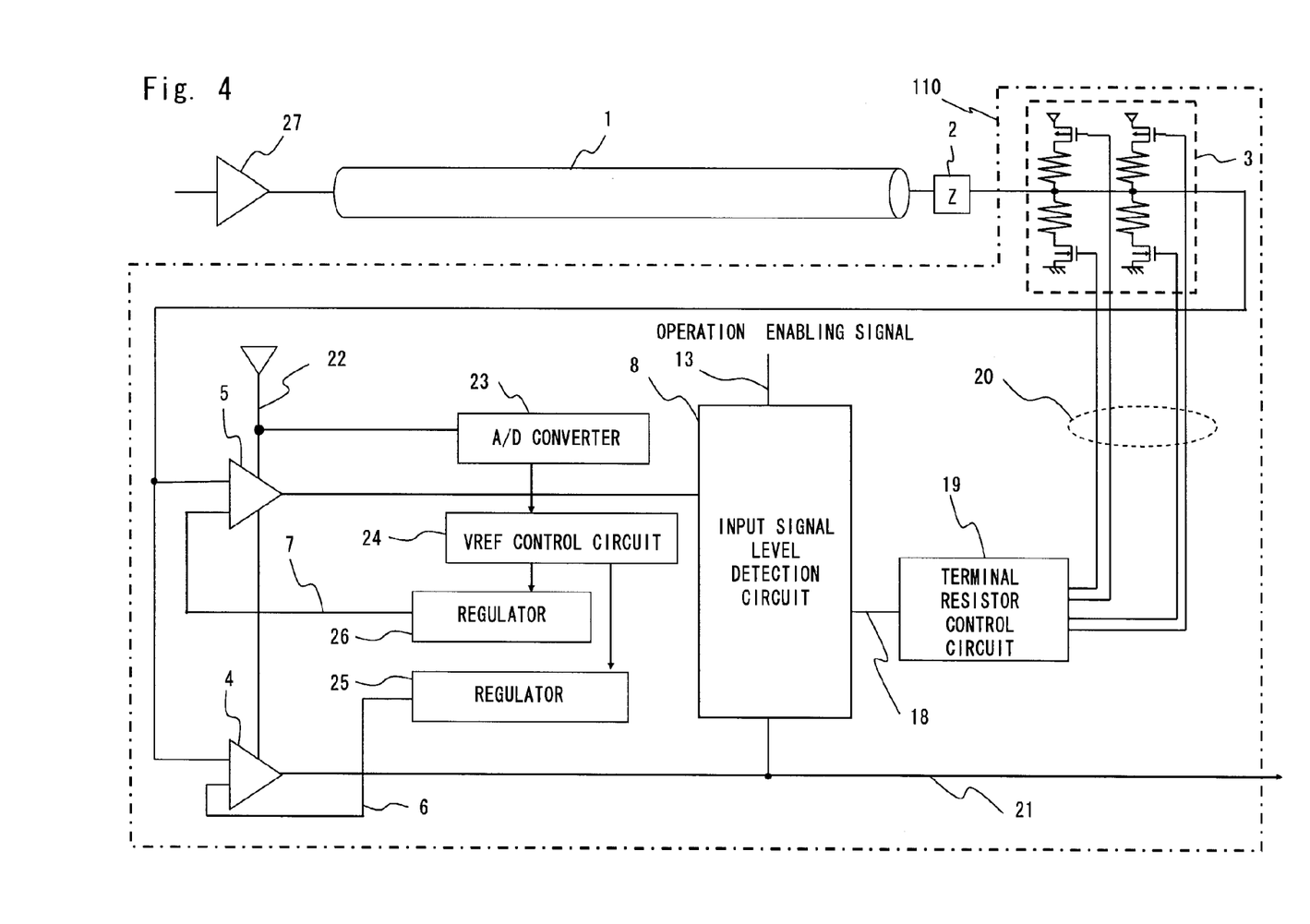
FIG. 4 is a block diagram showing an impedance adjustment circuit according to a second exemplary embodiment.

Referring now to FIG. 4, an impedance adjustment circuit according to the second exemplary embodiment will be described. Although reference potentials (VREFA 6 and VREFB 7) that are preliminarily set are used in the impedance adjustment circuit according to the first exemplary embodiment stated above, reference potentials VREFA 6 and VREFB 7 are set to optimal potentials using an A/D converter 23 even when power supply voltage of the input buffer is varied in the impedance adjustment circuit according to the second exemplary embodiment. In the following description, the difference between the first exemplary embodiment and the second exemplary embodiment will be mainly described, and the components and the processing similar to those of the first exemplary embodiment will be omitted.

FIG. 4 is a block diagram showing an impedance adjustment circuit of an input signal according to the second exemplary embodiment of the present invention. An impedance adjustment circuit 110 according to the second exemplary embodiment includes the A/D converter 23 that observes operation voltages of the first input buffer 4 and the second input buffer 5, a VREF control circuit 24 that controls output potentials of regulators based on the measurement result in the A/D converter 23, and a first regulator 25 and a second regulator 26 that generate VREFA 6 and VREFB 7 input to the first input buffer 4 and the second input buffer 5 in the semiconductor device, respectively, in addition to the structure of the impedance adjustment circuit 100 according to the first exemplary embodiment shown in FIG. 1. The first input buffer 4 and the second input buffer 5 are operated based on voltage 22 supplied from a power supply.

As described in the first exemplary embodiment, the impedance adjustment circuit according to the present invention detects that the potential of the input signal is temporarily decreased after overshoot is occurred in the input signal. The amplitude of the input signal depends on the operation voltages of the output buffer 27, the first input buffer 4, and the second input buffer 5. If the temporarily reduced potential of the input signal caused by overshoot stated above is significantly varied according to the operation voltages, the reference potentials (VREFA 6 and VREFB 7) need to be changed according to the voltage of the power supply 22 of the input buffers in order to optimize overshoot detection.

The A/D converter 23 measures the potential of the power supply voltage of the first input buffer 4 and the second input buffer 5, and outputs the measurement result to the VREF control circuit 24. The VREF control circuit 24 sets the outputs of the first regulator 25 and the second regulator 26 to potentials that are defined in advance according to the operation voltage 22 of the input buffers (first input buffer 4 and second input buffer 5) based on the result of the A/D converter 23. The first regulator 25 and the second regulator 26 switch potentials of the outputs of the regulators based on the output signals of the VREF control circuit 24.

The A/D converter 23 measures the voltage of the power supply 22 of the input buffers, and the VREF control circuit 24 changes the potentials of VREFA 6 and VREFB 7 output from the first regulator 25 and the second regulator 26, respectively, based on the measured voltage. For example, increase of the operation voltage 22 of the input buffers causes increase of potential for temporal voltage decrease after overshoot as stated above. Thus the VREF control circuit 24 controls the second regulator 26 to increase the potential of VREFB 7. When the potential of VREFB 7 is increased, the change value of the potential of VREFB 7 is specified in the VREF control circuit 24 in advance. In the same way, the VREF control circuit 24 reduces the potential of VREFB 7 when the operation voltage 22 of the input buffer is decreased.

Furthermore, in the impedance adjustment circuit according to the second exemplary embodiment, the output signal of the first input buffer 4 is not only used for detecting overshoot, but also used for receiving data from the transmission path 1. In this case, VREFA 6 is set to the reference value that is defined by the communication method to be employed. For example, when the DDR2 method is employed, the VREF control circuit 24 is preliminarily set to satisfy ½ of the power supply voltage of the input buffers. When the input buffer for receiving data is not commonly used with the first input buffer 4 or the second input buffer 5, VREFA 6 is also set to the optimal potential in which the input waveform from the transmission path 1 becomes High using the similar method as the case of changing the potential of VREFB 7 stated above. The other operations are similar to those of the first exemplary embodiment, and thus detailed description will be omitted here.

The impedance adjustment circuit 110 according to the second exemplary embodiment relates to a situation in which the optimal potentials of VREFA 6 and VREFB 7 in detecting overshoot are significantly changed according to the voltage change of the power supply with which the input buffers are operated. The impedance adjustment circuit 110 according to the second exemplary embodiment is able to optimize the potentials of VREFA 6 and VREFB 7 according to the fluctuation of the operation voltage. Hence, even when the voltage 22 of the input buffers are varied, the reference potentials can be set to the optimal values according to the operation voltage. Thus, the accuracy for detecting overshoot can be made even throughout the whole range of the operation voltage.

As described in the first and second exemplary embodiments, according to the impedance adjustment circuit of the present invention, it is possible to enhance reliability of data that is received in high-speed communication. The reason of this is that, since it is possible to judge presence or absence of occurrence of overshoot and the amplitude of the input signal and to optimize the impedance including the judgment result, the distortion of the signal waveform in the transmission path can be suppressed. Since the distortion of the signal waveform can be suppressed, the waveform can be close to the ideal one, providing a sufficient margin with respect to the standard value required in a signal waveform. Hence, the error of the received data can be prevented, and reliability of the data that is communicated can be enhanced.

Furthermore, according to the impedance adjustment circuit of the present invention, the communication speed in the high-speed communication can be increased. This is because, as stated above, suppressing the distortion of the signal waveform provides a sufficient margin with respect to the standard value in a signal waveform, thereby increases communication speed based on this margin.

Furthermore, according to the impedance adjustment circuit of the present invention, occurrence of overshoot and undershoot is judged based on presence or absence of so-called "swing-over" of the potential that is occurred subsequent to overshoot or undershoot, thereby sets the judgment level to be within an operation voltage range (0 V to VCC). Thus, only one kind of power supply voltage is sufficient.

Moreover, according to the impedance adjustment circuit of the present invention, two kinds of reference potentials are used. Hence, even when the impedance adjustment circuit of the present invention is applied to the input buffers in which transition of the output signal cannot be known in advance, it is possible to judge the period in which the signal is High by comparing one reference potential with the other. Thus, detection characteristic with high accuracy can be realized.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. An impedance adjustment circuit that controls impedance of a transmission path in which an input signal to input buffers provided in a semiconductor device is transmitted, the impedance adjustment circuit comprising:
    a termination resistor which is provided at a termination of the transmission path;
    a first comparator which detects that the input signal exceeds a certain first voltage;
    a second comparator which detects that the input signal exceeds a certain second voltage, the second voltage being higher than the first voltage;
    a first counter which performs count based on an output from the first comparator;
    a second counter which performs count based on an output from the second comparator, wherein the impedance adjustment circuit is configured to determine the presence or absence of overshoot of the input signal with respect to the second voltage based on the count in the first counter and the count in the second counter; and
    a termination resistor control circuit which controls impedance of the termination resistor based on the determined presence or absence of overshoot.

2. The impedance adjustment circuit according to claim 1, wherein
    when the second voltage is higher than the first voltage, and the input signal exceeds power supply voltage supplied to the first comparator and the second comparator and thereafter becomes temporarily lower than the power supply voltage, the second voltage is set to be higher than the lowest voltage detected in a period in which the input signal is lower than the power supply voltage.

3. The impedance adjustment circuit according to claim 1, wherein
    the termination resistor control circuit controls impedance of the termination resistor to be smaller when a count value output from the second counter is larger than a count value output from the first counter.

4. The impedance adjustment circuit according to claim 1, wherein
    the termination resistor control circuit controls impedance of the termination resistor to be larger when a count value output from the second counter is smaller than a count value output from the first counter.

5. The impedance adjustment circuit according to claim 1, further comprising a reference voltage control circuit that changes the first voltage and the second voltage, wherein
    the reference voltage control circuit changes the first voltage and the second voltage to certain voltages according to power supply voltage supplied to the first comparator and the second comparator.

6. The impedance adjustment circuit according to claim 1, further comprising a comparison circuit which compares a count result acquired from the first counter with a count result acquired from the second counter, wherein
    the termination resistor control circuit controls the impedance of the termination resistor based on output result from the comparison circuit.

7. An impedance adjustment circuit that controls impedance of a transmission path in which an input signal to input buffers provided in a semiconductor device is transmitted, the impedance adjustment circuit comprising:
    a termination resistor which is provided at a termination of the transmission path;
    a first comparator which detects that the input signal exceeds a certain first voltage;

a second comparator which detects that the input signal exceeds a certain second voltage, the second voltage being higher than the first voltage;

a first counter which performs count based on an output from the first comparator;

a second counter which performs count based on an output from the second comparator;

a termination resistor control circuit which controls impedance of the termination resistor based on the count in the first counter and the count in the second counter; and a count control circuit that controls count processing by the first counter based on the output from the first comparator and count processing by the second counter based on the output from the second comparator, wherein the count control circuit controls count processing by the first counter and the second counter based on an operation enabling signal that is input to the count control circuit.

8. The impedance adjustment circuit according to claim 7, wherein the count control circuit generates a first count signal from a logical AND between the output from the first comparator and the operation enabling signal and outputs the generated first count signal to the first counter, so as to generate a count operation period by the first counter according to the first count signal, and the count control circuit holds the output of the first comparator and the operation enabling signal using a hold circuit, generates a second count signal from a logical AND between the holding result and the output from the second comparator to output the generated second count signal to the second counter, so as to generate a count operation period by the second counter according to the second count signal.

9. An impedance adjustment circuit that controls impedance of a transmission path in which an input signal to input buffers provided in a semiconductor device is transmitted, the impedance adjustment circuit comprising:

a termination resistor which is provided at a termination of the transmission path;

a first comparator which detects that the input signal exceeds a certain first voltage;

a second comparator which detects that the input signal exceeds a certain second voltage, the second voltage being higher than the first voltage;

a first counter which performs count based on an output from the first comparator;

a second counter which performs count based on an output from the second comparator;

a reference voltage control circuit that changes the first voltage and the second voltage, wherein the reference voltage control circuit changes the first voltage and the second voltage to certain voltages according to power supply voltage supplied to the first comparator and the second comparator;

an A/D converter which measures the power supply voltage supplied to the first comparator and the second comparator; and a first regulator and a second regulator which control the first reference voltage and the second reference voltage to certain voltages, respectively, wherein the reference voltage control circuit performs control to change outputs from the first regulator and the second regulator based on the measurement result by the A/D converter.

* * * * *